(12) United States Patent
Deng et al.

(10) Patent No.: US 9,691,710 B1
(45) Date of Patent: Jun. 27, 2017

(54) SEMICONDUCTOR PACKAGE WITH ANTENNA

(71) Applicant: CYNTEC CO., LTD., Hsinchu (TW)

(72) Inventors: Joseph D. S. Deng, Taoyuan (TW);
Chia-Hsien Shen, New Taipei (TW);
Shu-Wei Chang, New Taipei (TW);
Kuan-Chih Huang, Chiayi County (TW)

(73) Assignee: CYNTEC CO., LTD, Hsinchu (TW)

( * ) Notice: Subject to any disclaimer, the term of this patent is extended or adjusted under 35 U.S.C. 154(b) by 0 days.

(21) Appl. No.: 14/959,768

(22) Filed: Dec. 4, 2015

(51) Int. Cl.
| | | |
|---|---|---|
| *H01L 21/00* | (2006.01) |
| *H01L 23/552* | (2006.01) |
| *H01L 23/66* | (2006.01) |
| *H01L 23/31* | (2006.01) |
| *H01L 23/498* | (2006.01) |
| *H01L 21/48* | (2006.01) |
| *H01L 21/56* | (2006.01) |
| *H01L 25/16* | (2006.01) |
| *H01L 23/00* | (2006.01) |

(52) U.S. Cl.
CPC ........ *H01L 23/552* (2013.01); *H01L 21/4853* (2013.01); *H01L 21/565* (2013.01); *H01L 23/3114* (2013.01); *H01L 23/49811* (2013.01); *H01L 23/66* (2013.01); *H01L 23/49822* (2013.01); *H01L 24/97* (2013.01); *H01L 25/16* (2013.01); *H01L 2223/6677* (2013.01); *H01L 2224/97* (2013.01)

(58) Field of Classification Search
CPC . H01L 23/498; H01L 21/561; H01L 23/5383; H01L 23/5389; H01L 23/552; H01L 23/66; H01L 24/97; H01L 25/16; H01L 23/49822; H01L 2223/6677; H01L 2224/97; H01L 2924/1531
USPC ........ 438/122, 127, 108, 109; 257/659, 757, 257/692, E21.508
See application file for complete search history.

(56) References Cited

U.S. PATENT DOCUMENTS

| | | | |
|---|---|---|---|
| 6,603,154 B2 * | 8/2003 | Sakai | H01L 23/3121 257/166 |
| 8,315,060 B2 * | 11/2012 | Morikita | H05K 1/0218 361/748 |
| 9,129,954 B2 * | 9/2015 | Yen | H01L 23/498 |

(Continued)

FOREIGN PATENT DOCUMENTS

| | | |
|---|---|---|
| TW | 201214652 A1 | 4/2012 |
| TW | 201220349 A1 | 5/2012 |

(Continued)

*Primary Examiner* — Thinh T Nguyen
(74) *Attorney, Agent, or Firm* — Birch, Stewart, Kolasch & Birch, LLP (57) ABSTRACT

A semiconductor package includes a substrate, a plurality of pin pads, a radio frequency (RF) pad, a semiconductor component, at least one surface mount device (SMD) component, a mold compound, a printed circuit board (PCB) antenna and a conductive solder. The RF pad is used to receive or transmit an RF signal on the top side of the substrate. The SMD component is mounted on the RF pad. The mold compound on the top side of the substrate covers the semiconductor component and the SMD component. The PCB antenna is located on the mold compound. Wherein, the conductive solder and the SMD component are stacked between the RF pad and a feeding structure of the PCB antenna.

8 Claims, 13 Drawing Sheets

(56) References Cited

U.S. PATENT DOCUMENTS

| | | | | |
|---|---|---|---|---|
| 2005/0039949 A1* | 2/2005 | Kosowsky | ............... | C25D 5/54 174/262 |
| 2008/0315396 A1* | 12/2008 | Kuhlman | ............ | H01L 23/3121 257/692 |
| 2011/0013349 A1* | 1/2011 | Morikita | .............. | H05K 1/0218 361/679.02 |
| 2014/0252595 A1* | 9/2014 | Yen | ....................... | H01L 23/498 257/737 |

FOREIGN PATENT DOCUMENTS

| | | | |
|---|---|---|---|
| TW | 201347103 A | 11/2013 |
| TW | 201436166 A | 9/2014 |
| TW | 201436361 A | 9/2014 |

\* cited by examiner

SEMICONDUCTOR PACKAGE WITH ANTENNA

CROSS REFERENCE TO RELATED APPLICATIONS

None

BACKGROUND OF THE INVENTION

1. Field of the Invention

The present invention relates to a semiconductor package, and more particularly to a semiconductor package with antenna.

2. Description of the Related Art

Wireless communication devices, such as wearable point-of-sale (POS) terminals, require antennas and a wireless function circuit with a plurality of wireless components (for example, a wireless IC with RF communication capability) for processing, transmitting and receiving RF signals. Conventionally, a wireless communication device includes an antenna and a wireless function circuit respectively disposed on different parts of a system circuit board. Under the conventional approach, the antenna and the wireless function circuit are separately manufactured and electrically connected to each other after being placed on the system circuit board. Since separate sets of part are separately manufactured, higher manufacturing costs are incurred. Moreover, the conventional approach makes it more difficult to achieve a compact product design.

Furthermore, since RF signals are high-frequency signals, electromagnetic interference (EMI) or local oscillator (LO) leakage may easily occur. EMI or LO leakage may interrupt, obstruct or otherwise degrade or limit the effective performance of the circuit. As is known in the art, electromagnetic interference protection can be achieved by using an electromagnetic interference shielding frame covering the system circuit board.

Therefore, wireless communication devices design must take the arrangement of the antenna and wireless components of the wireless function circuit into consideration. However, the wireless function circuit is not formed as a module or package, and plural wireless components of the wireless function circuit are designed to be disposed on the system circuit board. It is well-known that the layer number, the thickness or materials of the system circuit board are different for each of the wireless communication devices. Consequently, an arrangement of the antenna, layout and wireless components of a wireless function circuit cannot be applied to other wireless communication devices for reaching the same wireless performance.

SUMMARY OF THE INVENTION

An object of the present invention is to provide a semiconductor package that can act as a package component and can also be applied to a system circuit board of a general wireless communication device with LO leakage that can be reduced easily and controlled precisely by adjusting isolation between the PCB antenna and the wireless function circuit.

In accordance with an aspect of the present invention, a semiconductor package includes a substrate having a top side and a bottom side; a plurality of pin pads disposed on the bottom side of the substrate; a radio frequency (RF) pad configured to receive or transmit an RF signal on the top side of the substrate; a semiconductor component mounted on the top side of the substrate; a first surface mount device (SMD) component mounted on the RF pad; a mold compound disposed on the top side of the substrate and covering the semiconductor component and the first SMD component; a printed circuit board (PCB) antenna on the mold compound; and a first conductive solder disposed on the mold compound; wherein the first conductive solder and the first SMD component are stacked with each other and disposed between the RF pad and a feeding structure of the PCB antenna.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given byway of illustration only, and thus are not limitative of the present invention, and wherein.

DETAILED DESCRIPTION

The present invention will now be described in detail with reference to the accompanying drawings, wherein the same reference numerals will be used to identify the same or similar elements throughout the several views. It should be noted that the drawings should be viewed in the direction of orientation of the reference numerals.

Figure 1:
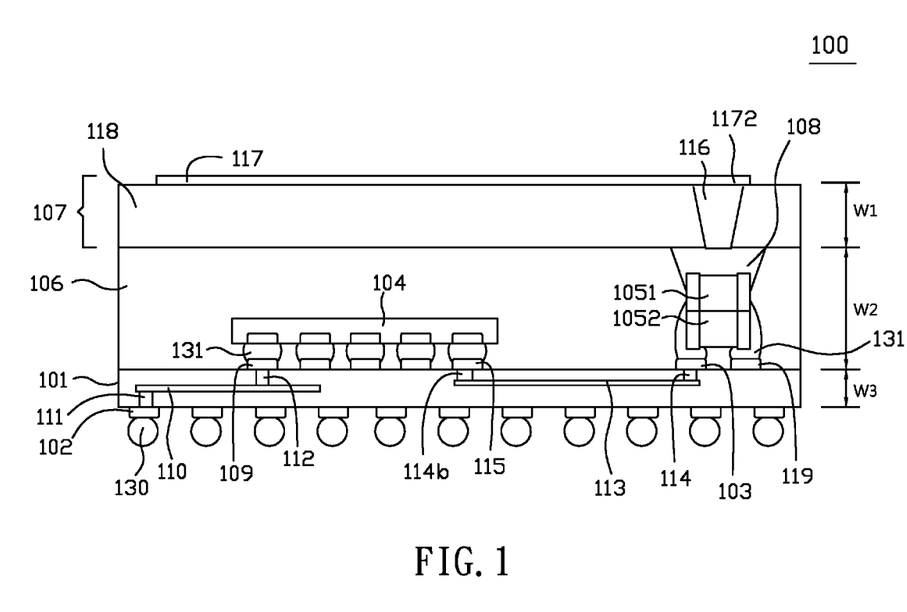
FIGS. 1-4 are cross-sectional views showing a structure of a semiconductor package with antenna according to embodiments of the present invention, respectively.

FIG. 1 is a cross-sectional view showing a structure of a semiconductor package with antenna according to an embodiment of the present invention. As shown in FIG. 1, the semiconductor package 100 includes a substrate 101, a plurality of pin pads 102, a radio frequency (RF) pad 103 (hereinafter referred as RF pad), a semiconductor component 104, at least one first surface mount device (SMD) component 1051 (hereinafter referred as SMD component), a mold compound 106, a printed circuit board (PCB) antenna 107 (hereinafter referred as PCB antenna), and a first conductive solder 108. The pin pads 102 are disposed on a bottom side of the substrate 101. The RF pad 103 and at least one component pad 109 are disposed on a top side of the substrate 101.

The substrate 101 further includes layouts and vias on the top side, the bottom side or in the interior thereof to interconnect with the RF pad 103, the component pad 109 and the pin pads 102. For example, the ground plane layout 110 embedded in the interior of the substrate 101 is indirectly connected with the component pad 109 and the pin pad 102 by vias 111, 112, an indirect electrical connection between the RF pad 103 and the component pad 115 is configured through the layout 113 and vias 114, 114b in the interior of the substrate 101. Similarly, the semiconductor component 104 and other components (not shown) are mounted on the component pads 109, 115 by solder such as tin alloy. The semiconductor package 100 further includes a plurality of solder balls 130 disposed on the pin pad 102.

In an embodiment, the first electrodes of the two first SMD components 1051, 1052 are mounted on the RF pad 103 and stacked upward with each other from the top surface of the substrate 101 by solder such as tin alloy. The second electrodes of the two first SMD components 1051, 1052 are mounted on a dummy pad 119. An RF signal passes through a feeding structure 116 of the PCB antenna 107 and the first electrode of the two first SMD components 1051, 1052 in the order from the PCB antenna 107 to the RF pad 103. In an embodiment, the mold compound 106 can be epoxy and disposed on the top side of the substrate 101 to cover the semiconductor component 104 and the two first SMD components 1051, 1052. In other words, a space between the PCB antenna 107 and the substrate 101 is filled with the mold compound 106. In an embodiment, the two first SMD components 1051, 1052 can be metallic structure.

In some embodiments, the PCB antenna 107 is a laminated structure and includes a patterned antenna 117, a feeding structure 116 and at least one isolation layer 118. In an embodiment, the PCB antenna 107 is a flexible printed circuit. The patterned antenna 117 is disposed on the top side of the isolation layer 118 or the bottom of the isolation layer 118. The feeding structure 116 is connected with a feeding terminal 1172 of the patterned antenna 117 and passes through the isolation layer 118. The PCB antenna 107 is disposed on the mold compound 106. In this configuration, the feeding structure 116 of the PCB antenna 107 is located above the two first SMD components 1051, 1052 corresponding to the RF pad 103. The feeding structure 116 is electrically connected with at least one electrode of the two first SMD components 1051, 1052 by the first conductive solder 108. In this embodiment, the feeding structure 116 is electrically connected with the first electrode and the second electrode of the two first SMD components 1051, 1052 by the first conductive solder 108. The first conductive solder 108 and the two first SMD components 1051, 1052 are stacked with each other and located between the RF pad 103 and the feeding structure 116 of the PCB antenna 107. The patterned antenna 117 is disposed on the top of the isolation layer 118 and connected with the feeding structure 116. In some embodiments, the first conductive solder is made of a material selected from a group consisting of graphite, nickel, tin, silver, copper, or a combination thereof.

In some alternative embodiments, the patterned antenna 117 is disposed on the bottom of the isolation layer 118 or in the interior of the isolation layer 118. The feeding structure 116 of the PCB antenna 107 is electrically connected to the two first SMD components 1051, 1052 by the first conductive solder 108. The RF signal can be received or transmitted in the patterned antenna 117, the feeding structure 116, the two first SMD components 1051, 1052 and the RF pad 103.

In an embodiment, the semiconductor component 104 is a baseband IC and forms a wireless function circuit with other components (not shown) on the substrate 100. The PCB antenna 107 and the wireless function circuit are packaged together, so that the semiconductor package 100 acts as a package component and can be applied to a system circuit board of a general wireless communication device, such as wearable point-of-sale (POS) terminal or portable barcode scanner. The LO leakage of the semiconductor package by using the PCB antenna 107 can be reduced easily and controlled precisely by adjusting isolation between the PCB antenna 107 and the wireless function circuit. In an embodiment, an isolation distance between the PCB antenna 107 and the semiconductor component 104 can be reduced easily and controlled precisely so as to achieve the optimal isolation. The isolation distance includes the thickness W1, W2, W3 of the PCB antenna 107, the mold compound 106 and the substrate 101. In an embodiment, the thickness W1, W2, W3 of the PCB antenna 107, the mold compound 106 and the substrate 101 are 1, 0.7 and 0.28 mm, respectively. In particularly, the LO leakage may be improved by increasing the thickness W1 of the PCB antenna 107.

Figure 2:
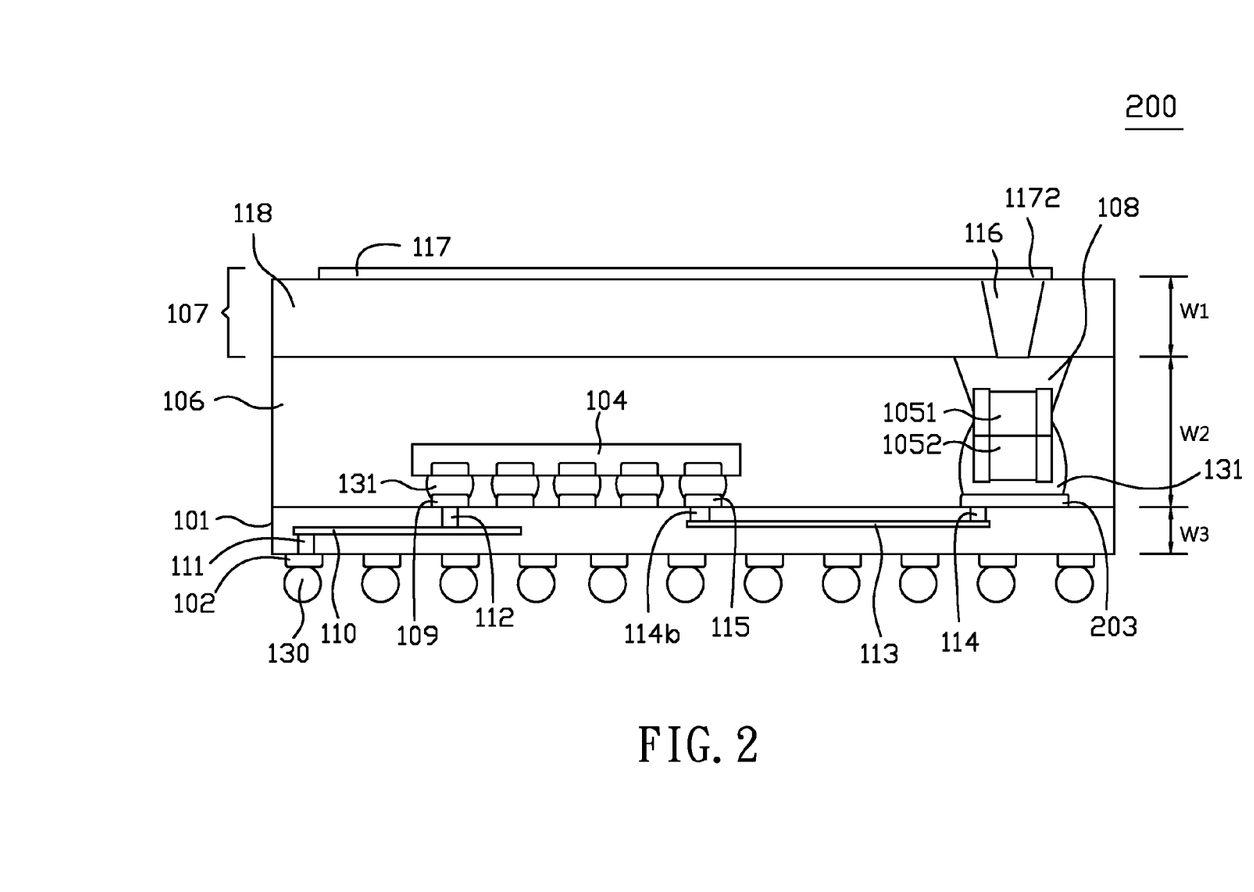

FIG. 2 is a cross-sectional view showing a structure of a semiconductor package with antenna according to an embodiment of the present invention. As shown in FIG. 2, in this embodiment, the structure of the semiconductor package 200 is similar to that of the semiconductor package 100. The difference between the semiconductor package 200 and the semiconductor package 100 is that the RF pad 203 extends from the first electrode of the two first SMD components 1051, 1052 to the second electrode of the two first SMD components 1051, 1052 to entirely cover the two first SMD components 1051, 1052 in the electrode separated direction. The first electrode and the second electrode of the two first SMD components 1051, 1052 are disposed on the RF pad 203 by the first conductive solder 108.

Figure 3:
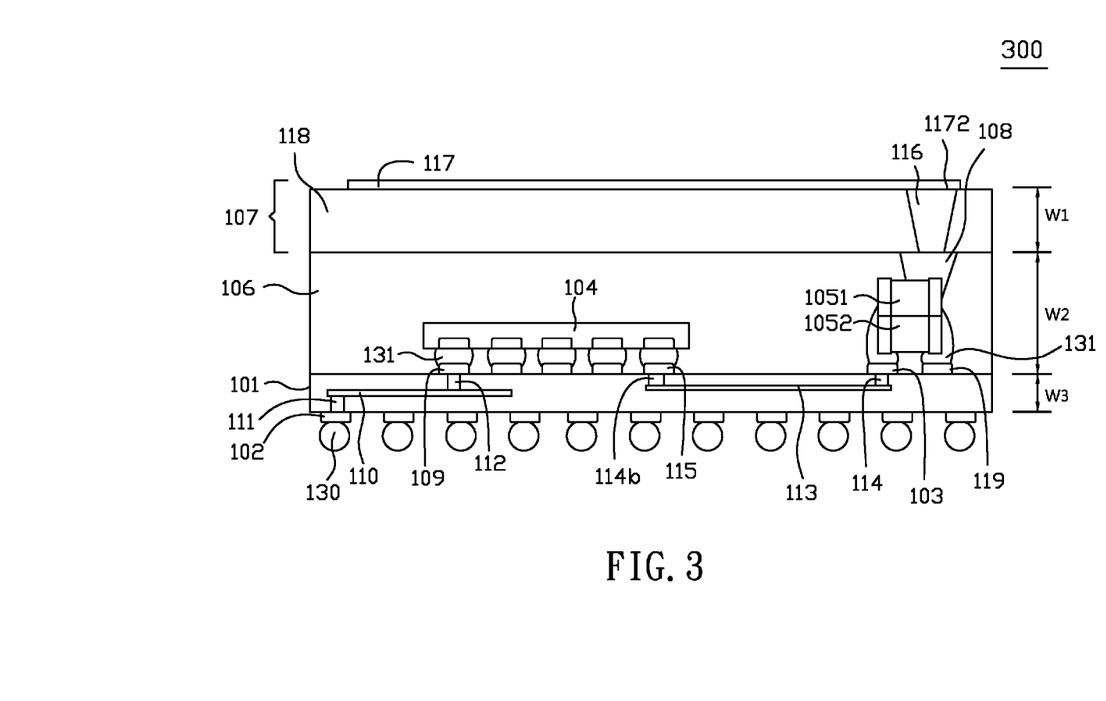

FIG. 3 is a cross-sectional view showing a structure of a semiconductor package with antenna according to an embodiment of the present invention. As shown in FIG. 3, in this embodiment, the structure of the semiconductor package 300 is similar to that of the semiconductor package 100. The difference between the semiconductor package 300 and the semiconductor package 100 is that the feeding structure 116 of the PCB antenna 107 is only electrically connected with the first electrode of the two first SMD components 1051, 1052 by the first conductive solder 108. The two first SMD components 1051, 1052 are connected in series with the RF pad 103 and the feeding structure 116 of the PCB antenna 107 for impedance matching. The first electrode of the two first SMD components 1051, 1052 is in contact with the RF pad 103, and the second electrode of the two first SMD components 1051, 1052 is connected with the feeding structure 116 via the first conductive solder 108. In an embodiment, each of the two first SMD components 1051, 1052 can be a resistor, a capacitor, an inductor, a filter, a diplexer, a triplexer or a balun, conductive component such as copper, respectively.

Figure 4:
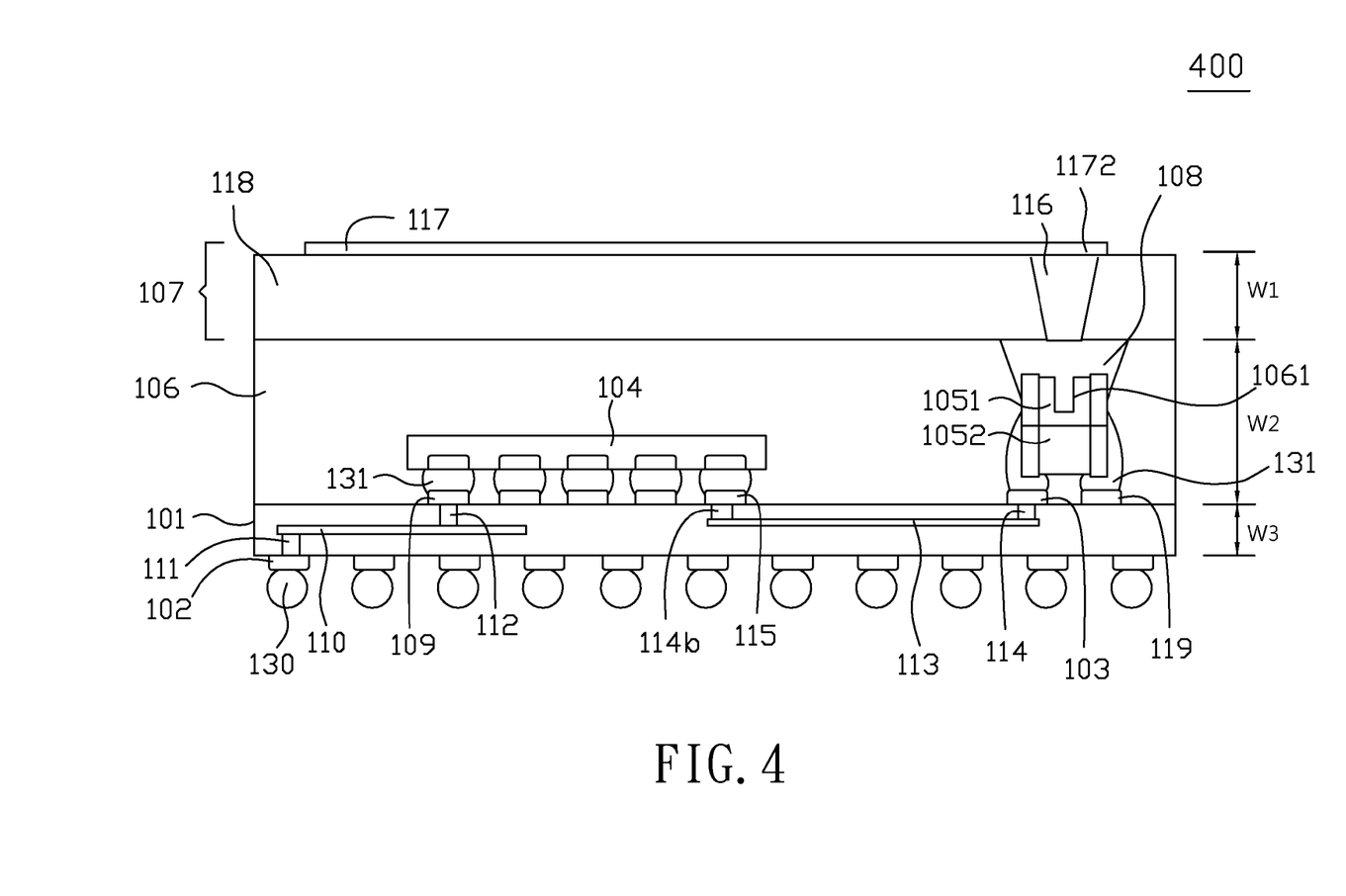

FIG. 4 is a cross-sectional view showing a structure of a semiconductor package with antenna according to an embodiment of the present invention. As shown in FIG. 4, in this embodiment, the structure of the semiconductor package 400 is similar to that of the semiconductor package 100. The difference between the semiconductor package 400 and the semiconductor package 100 is that the two first SMD components 1051, 1052 include at least one cavity 1061, and the first conductive solder 108 is disposed on the cavity 1061 between the two first SMD components 1051, 1052 and the feeding structure 116 of the PCB antenna 107. The two first SMD components 1051, 1052 with the cavity 1061 have greater surface area to contact the first conductive solder 108 compared to the two first SMD components 1051, 1052 of the semiconductor package 100.

Figure 5:
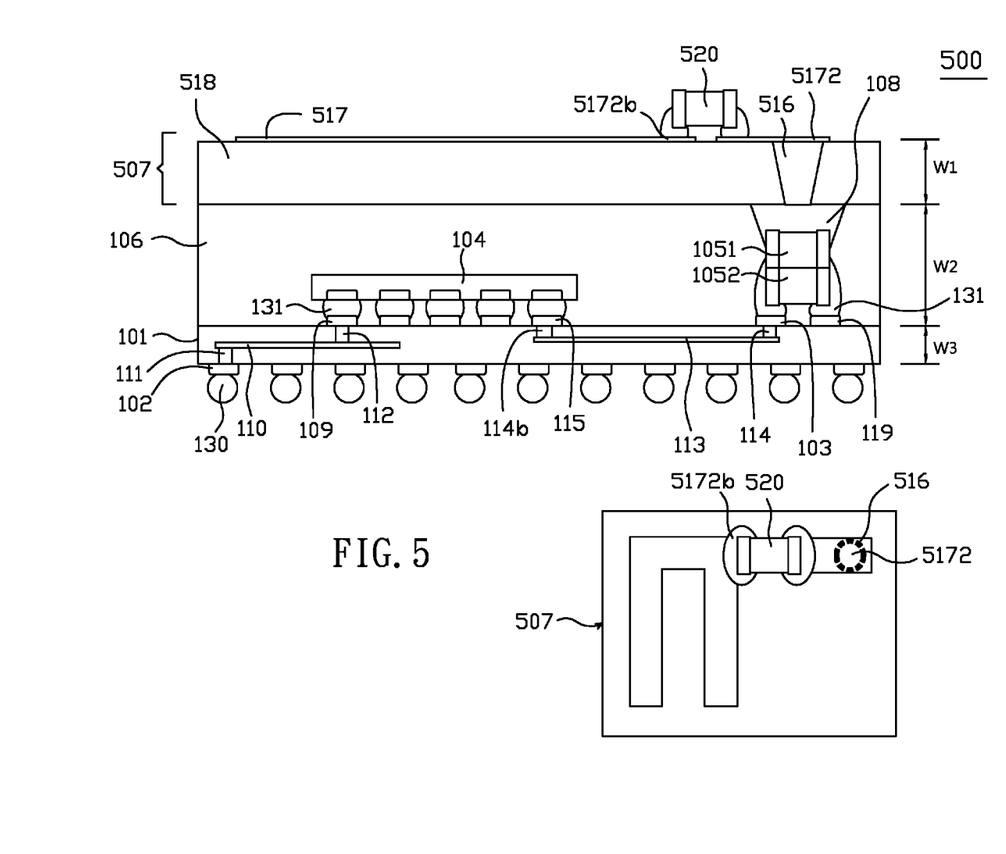
FIGS. 5, 6A and 6B are cross-sectional views and top views showing a structure of a semiconductor package with antenna according to embodiments of the present invention, respectively.

FIG. 5 is a cross-sectional view and top view showing a structure of a semiconductor package with antenna according to an embodiment of the present invention. As shown in FIG. 5, in this embodiment, the structure of the semiconductor package 500 is similar to that of the semiconductor package 100. The difference between the semiconductor package 500 and the semiconductor package 100 is that the semiconductor package 500 further includes a matching component 520 mounted on a top layer ora bottom layer of the PCB antenna 507 for impedance matching. The matching component 520 is connected in series with the RF pad 103 and a terminal (feeding node 5172*b* or feeding terminal 5172 above the feeding structure 516) of a patterned antenna 517 of the PCB antenna 507.

Figure 6A:
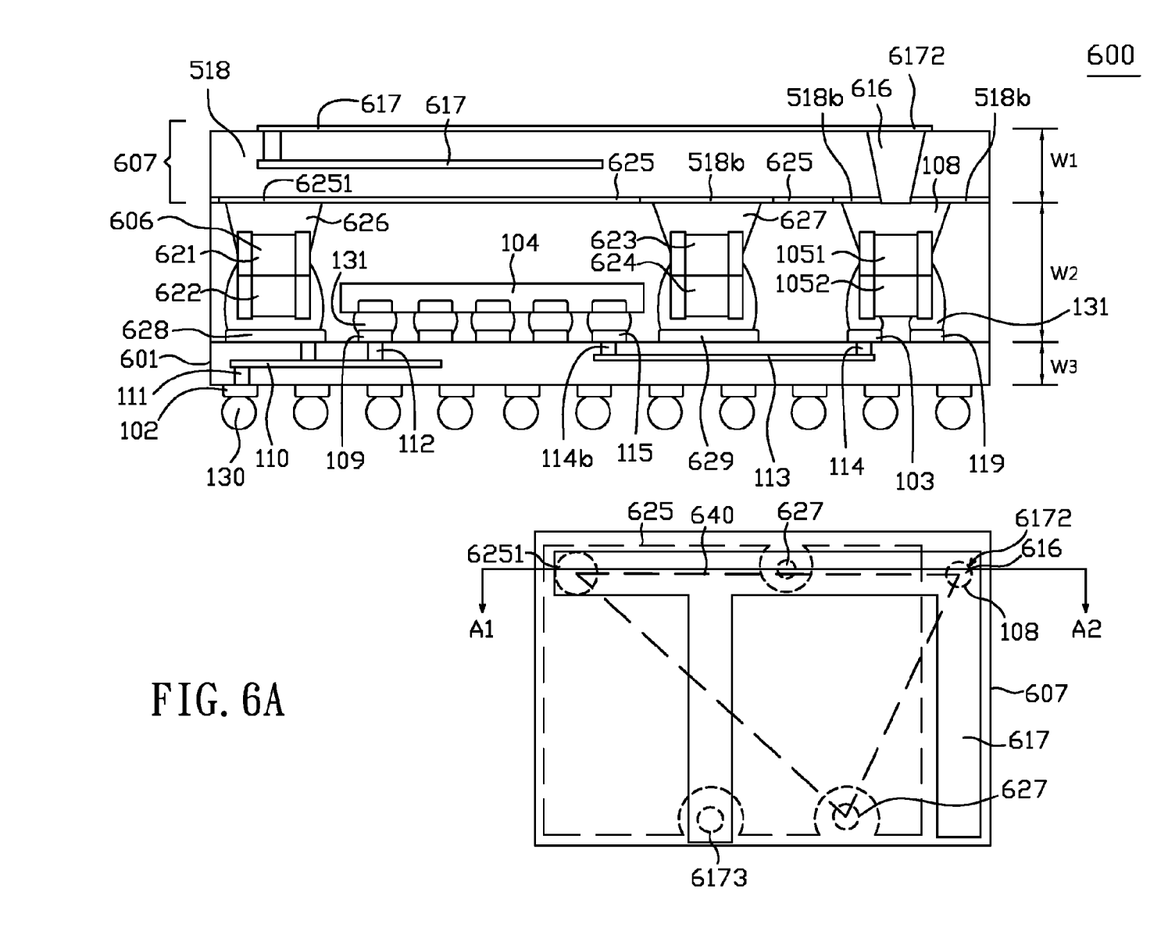

FIG. 6A is a cross-sectional view of the line A1-A2 and top view showing a structure of a semiconductor package with antenna according to an embodiment of the present invention. As shown in FIG. 6A, in this embodiment, the structure of the semiconductor package 600 is similar to that of the semiconductor package 100. The difference between the semiconductor package 600 and the semiconductor package 100 is that the semiconductor package 600 further includes at least one second SMD components 621, 622, at least one third SMD components 623, 624, a second conductive solder 626 and a third conductive solder 627, and the PCB antenna 607 further includes a shielding plane 625 disposed on the bottom layer of the PCB antenna 607 in order to avoid disturbing the semiconductor component 104 by electromagnetic interference (EMI). In some embodiments, the PCB antenna 607 further includes a middle layer disposed between the top layer and the bottom layer. The patterned antenna 617 is disposed on the top layer and the middle layer of the PCB antenna 607. The feeding structure 616 is connected to the feeding terminal 6172 of the patterned antenna 617. The different layers of the patterned antenna 617 of the PCB antenna 607 can be connected with each other by via. In some embodiments, the PCB antenna 607 further includes protection layer 518*b* on the bottom of the PCB antenna 607 or the top of the PCB antenna 607 to cover major portion of the shielding plane 625, the patterned antenna 617 or recesses of the isolation layer 518.

In an embodiment, the at least one first electrode of the two second SMD components 621, 622 are mounted on the ground pad 628 and stacked upward with each other from the top surface of the substrate 601 by solder such as tin alloy. A contact pad 6251 of the shielding plane 625 is connected with the two second SMD components 621, 622 by second conductive solder 626. Similarly, the at least one first electrode of the two third SMD components 623, 624 are selectively mounted on the dummy pad 629 or the ground pad (not shown), and stacked upward with each other from the top surface of substrate 601 by solder such as tin alloy. The third conductive solder 627 is in contact with the bottom of the PCB antenna 607 and the two third SMD components 623, 624. The ground pad 628 is indirectly connected with the pin pad 102 by via and layout in the interior of the substrate 601.

Figure 6B:
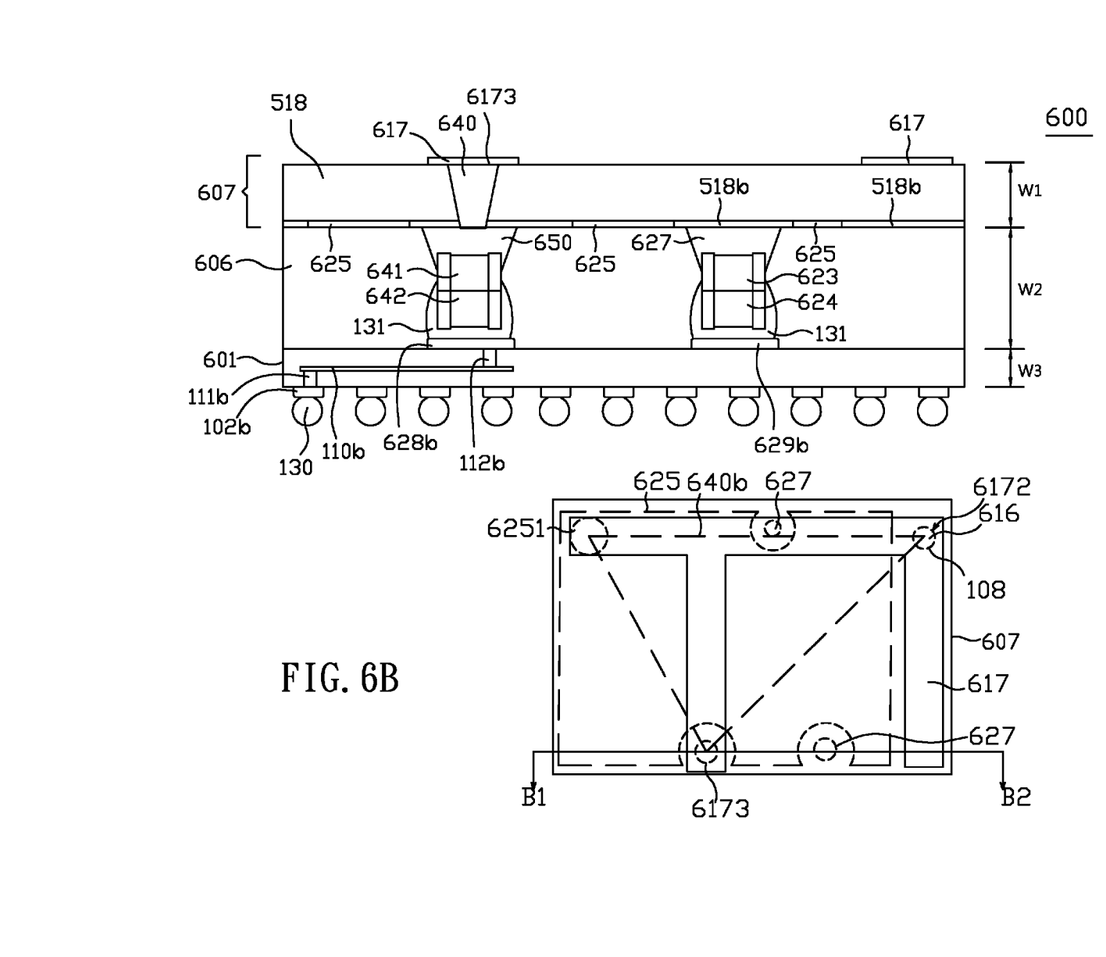

FIG. 6B is a cross-sectional view of the line B1-B2 and top view showing a structure of a semiconductor package with antenna according to an embodiment of the present invention. As shown in FIG. 6B, the cross-sectional view of the semiconductor package 600 is another cross-sectional view of the semiconductor package 600. The third conductive solder 627, the two third SMD components 623, 624 and dummy pad 629*b* on the substrate are similar to the connection structure of semiconductor package 600 in FIG. 6A. The PCB antenna 607 further includes a short structure 640 being connected to a short terminal 6173 of the patterned antenna 617 and passes through the isolation layer 518. Similarly, the short structure 640 of the PCB antenna 607 is located above at least one fourth SMD component 641,642 corresponding to the ground pad 628*b*. The short structure 640 is electrically connected with at least one electrode of the fourth SMD component 641,642 by the fourth conductive solder 650. The ground plane layout 110*b* embedded in the interior of the substrate 601 is indirectly connected to the ground pad 628*b* and the pin pad 102*b* by vias 111*b*, 112*b*. A connection line of the placement of three of the two first SMD components 1051, 1052, the two second SMD components 621, 622, the two third SMD components 623, 624 and the fourth SMD component 641,642 form triangle outline 640, 640*b* to balance the contact force between the PCB antenna 607 and mold compound 606.

Figure 7:
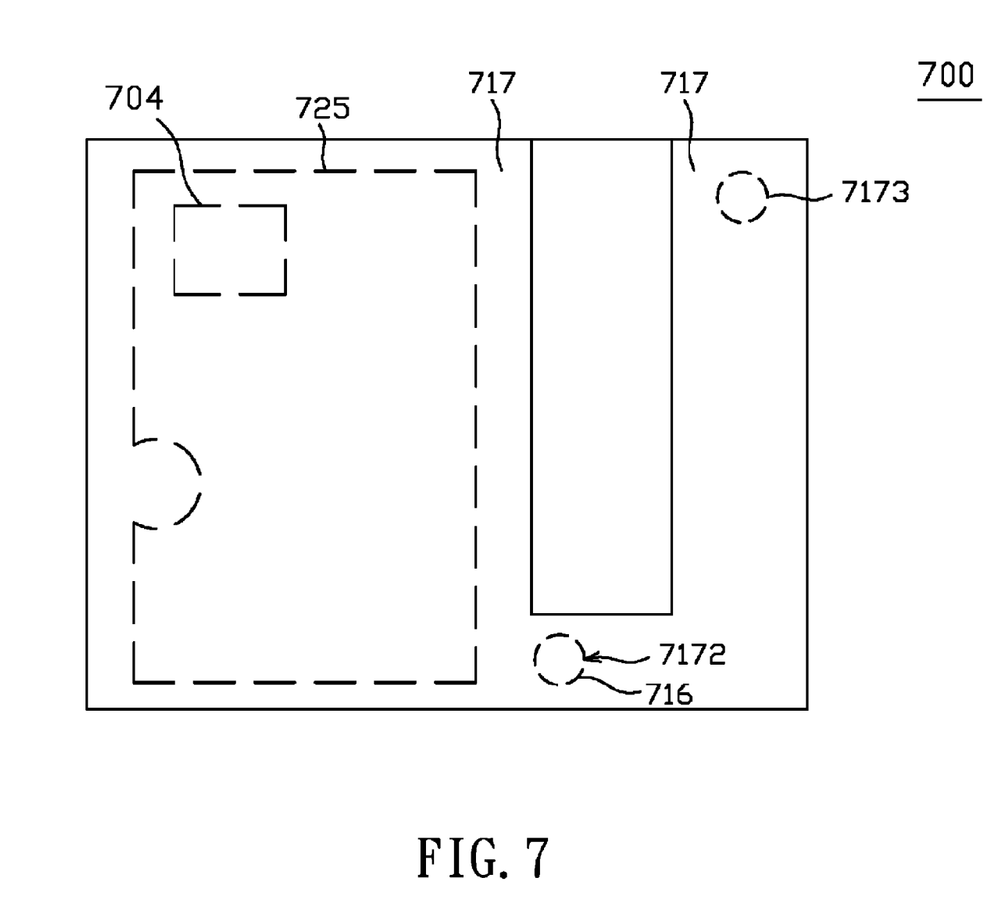
FIGS. 7 and 8 are top views of semiconductor package with antenna according to an embodiment of the present invention.

FIG. 7 is a top view of the semiconductor package according to an embodiment of the present invention. As shown in FIG. 7, the shielding plane 725 is directly disposed above the semiconductor component 704 and covers the semiconductor component 704 and partially overlaps with the patterned antenna 717 (U shape) from the top of the semiconductor package. The patterned antenna 717 further includes a short terminal 7173 that is connected to a ground pad on the substrate (not shown) and passes through the isolation layer. The connection structure between the short terminal 7173 of the PCB antenna 700 and the ground pad on the substrate is similar to connection structure of the feeding terminal and the RF pad. The short terminal 7173 of the PCB antenna 700 is located above at least one surface mount device (SMD) component corresponding to the ground pad on the substrate. In an embodiment, the electrodes of the two SMD components are mounted on the ground pad and stacked upward with each other from the top surface of the substrate by solder such as tin alloy. The short terminal 7173 is electrically connected to at least one electrode of the two SMD components by the conductive solder. The patterned antenna 717 with the short terminal 7173 can further forms shielding effect in out-band frequency of the patterned antenna 717 to increase EMI shielding performance.

Figure 8:
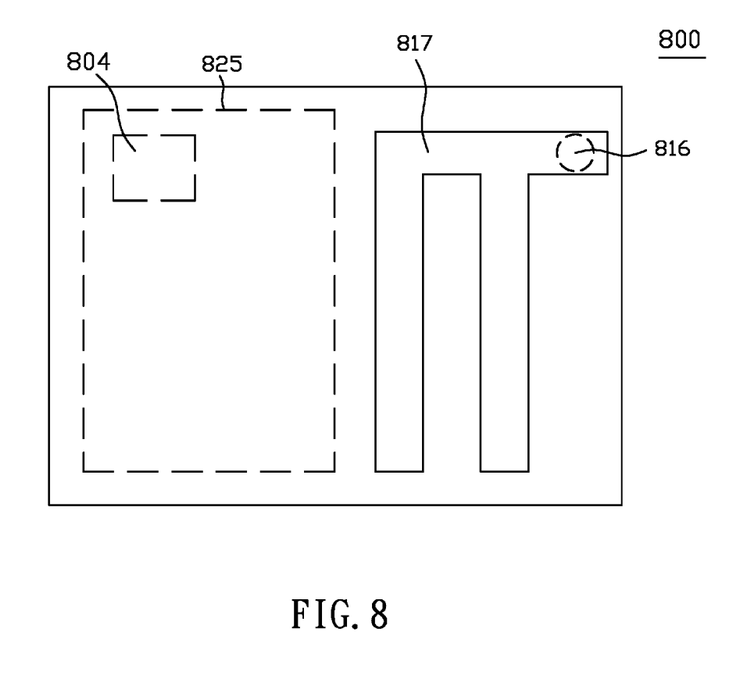

FIG. 8 is a top view of the semiconductor package according to an embodiment of the present invention. As shown in FIG. 8, the shielding plane 825 of the PCB antenna 800 is directly disposed above the semiconductor component 804 and only covers semiconductor component 804 from the top of the semiconductor package. The patterned antenna 717 (F shape) is located outside the placement of shielding plane 825 from the top of the semiconductor package 800. Antenna performance of the PCB antenna 800 with the non-overlapping shielding plane 825 is better than the PCB antenna 700 with the overlapping shielding plane 725. In some embodiments, the patterned antenna of the PCB antenna can be a monopole type, PFIA type, F-type, U-type or strip line type. In some embodiments, the shielding plane of the PCB antenna is directly disposed above all components on the substrate including the semiconductor component except the first SMD components, the third SMD components or the fourth SMD components, and the patterned antenna is located outside the placement of shielding plane from the top of the semiconductor package for batter shielding performance.

Figure 9:
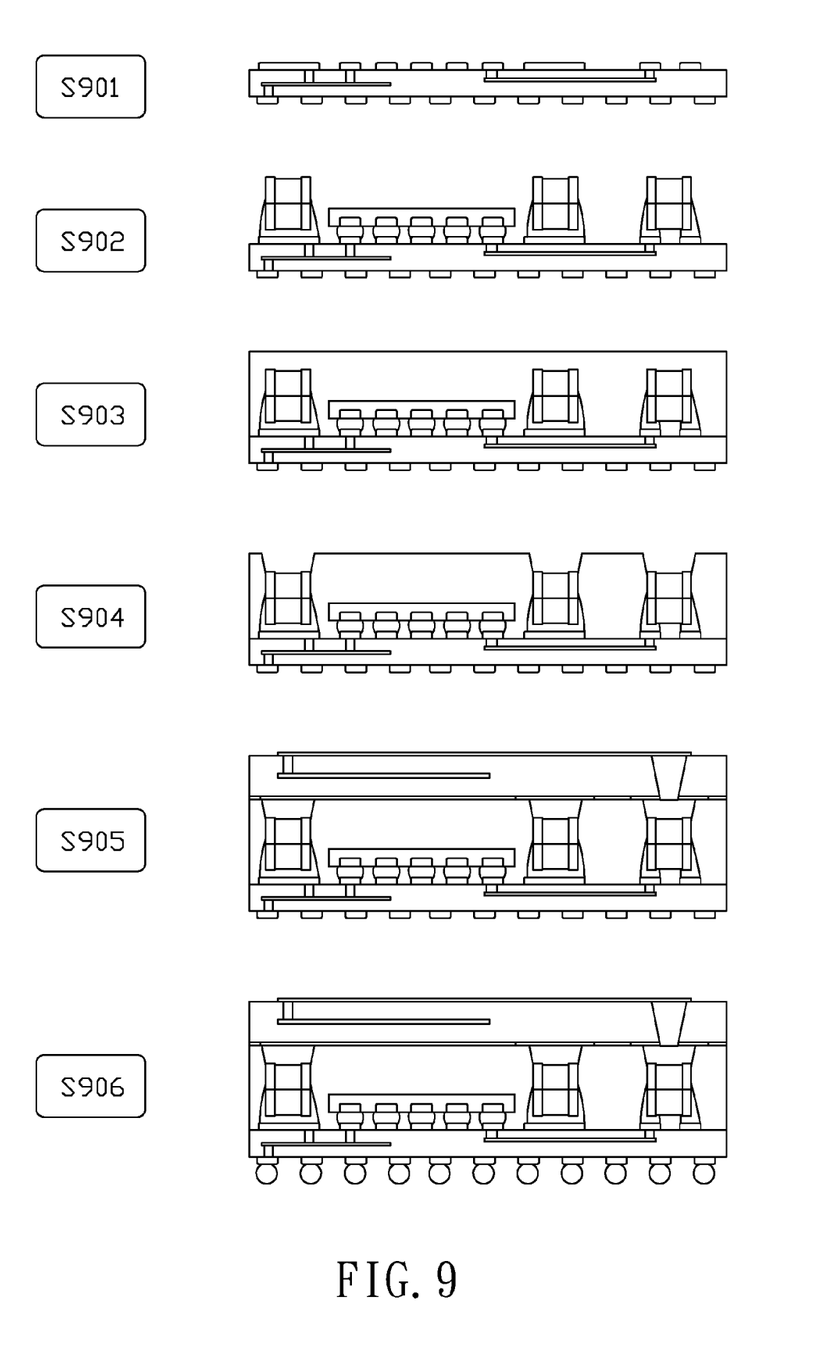
FIG. 9 is a flowchart showing of a method of assembling the semiconductor package with antenna of FIG. 6A.

FIG. 9 is a flowchart showing a method of assembling the semiconductor package with antenna of FIG. 6A. The method includes but not limited to the following steps:

Step S901: prepare a substrate 601;

Step S902: place and dispose the semiconductor component 104 and at least one first SMD components on substrate 601;

Step S903: form mold compound 606;

Step S904: form at least one opening (drill holes or saw openings) to make the first, second and third SMD components exposed;

Step S905: assemble the PCB antenna 607 and the mold compound 606 by the first conductive solder 108 to the third conductive solder 627; and Step S906: place solder balls 130 on the pin pads of the substrate 601.

In step S901, the substrate 601 may be prepared for supporting electronic components. In step S902, the semiconductor component 104 and at least one first SMD components are placed and disposed on the top side of the substrate 601. In step S903, a mold compound 606 such as epoxy mold compound is formed on the top side of the substrate 601. In an embodiment, the mold compound 606 completely covers the top side of the substrate 601 including regions of the two first SMD components 1051, 1052, the semiconductor component 104 mounted on the top side of the substrate 601.

In step S904, a drilling process using laser to drill holes to make the first, second and third SMD components exposed from the holes (openings). The drilling depth (open depth) is smaller than the thickness W2 of the mold compound 606. In some alternative embodiments, a sawing process using blade sawing, wire sawing, mechanical drill, or laser open to make the first, second and third SMD components exposed from the openings is used. In step S905, the PCB antenna 607 and the mold compound 606 are assembled by the first conductive solder 108 to the third conductive solder 627 such as copper paste, silver paste, Tin, Tin alloy or conductive paste filled in the drill holes directly above the first, second and third SMD components, respectively. In step S906, the solder balls 130 are placed on the pin pads 102 of the substrate 601. In some embodiments, step S906 can be performed before one of step S902 to step S905.

In some embodiments, the method further includes but not limited to one or more of the following steps:

Step S902b: clean flux on the substrate 601;

Step S903b: cure the mold compound 606;

Step S906b: separate the semiconductor package 600 from other semiconductor packages on the substrate 601.

The encapsulation process in step S903 is preformed after flux on the substrate 601 has been clean in step S902b so that process flow can avoid delamination between the substrate 601 and the mold compound 606. In step S903b, the curing process can reduce harden time of the mold compound 606. In step S906b, the semiconductor packages on the substrate 601 may be separated from each other. During a semiconductor package fabrication process, a single substrate, in this case a substrate 601, may include a plurality of semiconductor packages. After all of the semiconductor packages on the substrate 601 have been built, the semiconductor packages may be separated from each other through dicing. The number of semiconductor packages built in one substrate 601 may depend on the size of the substrate 601, the area needed to build the semiconductor package, the number of components and the material of the mold compound 606.

Figure 10:
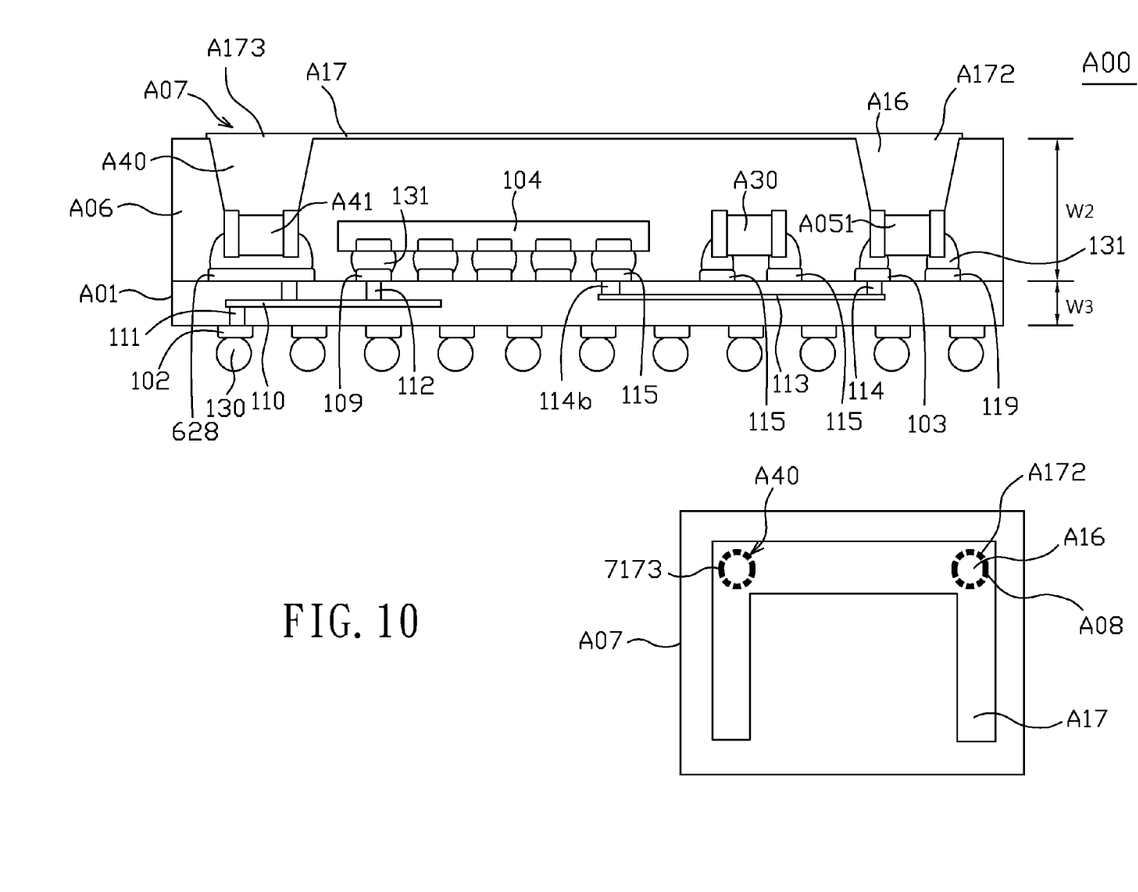
FIGS. 10 and 11 are cross-sectional views and top views showing a structure of a semiconductor package with antenna according to embodiments of the present invention, respectively.

FIG. 10 is a cross-sectional view and a top view showing a structure of a semiconductor package with antenna according to an embodiment of the present invention. As shown in FIG. 10, in this embodiment, the structure of the semiconductor package A00 is similar to that of the semiconductor package 600. The major difference between the semiconductor package A00 and the semiconductor package 600 is that the antenna structure of the semiconductor package A00 is changed from the PCB antenna 607 to a conformal antenna A07 by screen printing. The end of the feeding structure A16 is electrically connected to the feeding terminal A172 of the patterned antenna A17. The other end of feeding structure A16 is directly connected to at least one electrode of the first SMD component A051. Similarly, the end of the short structure A40 is electrically connected to the short terminal A173 of the patterned antenna A17. The other end of the short structure A40 is directly connected to at least one electrode of the fourth SMD component A41. Configuration of the mold compound A06, the substrate A01 and passive components A30 of the semiconductor package A00 is similar to the semiconductor package 600, and the detailed description is not given here again.

Figure 11:
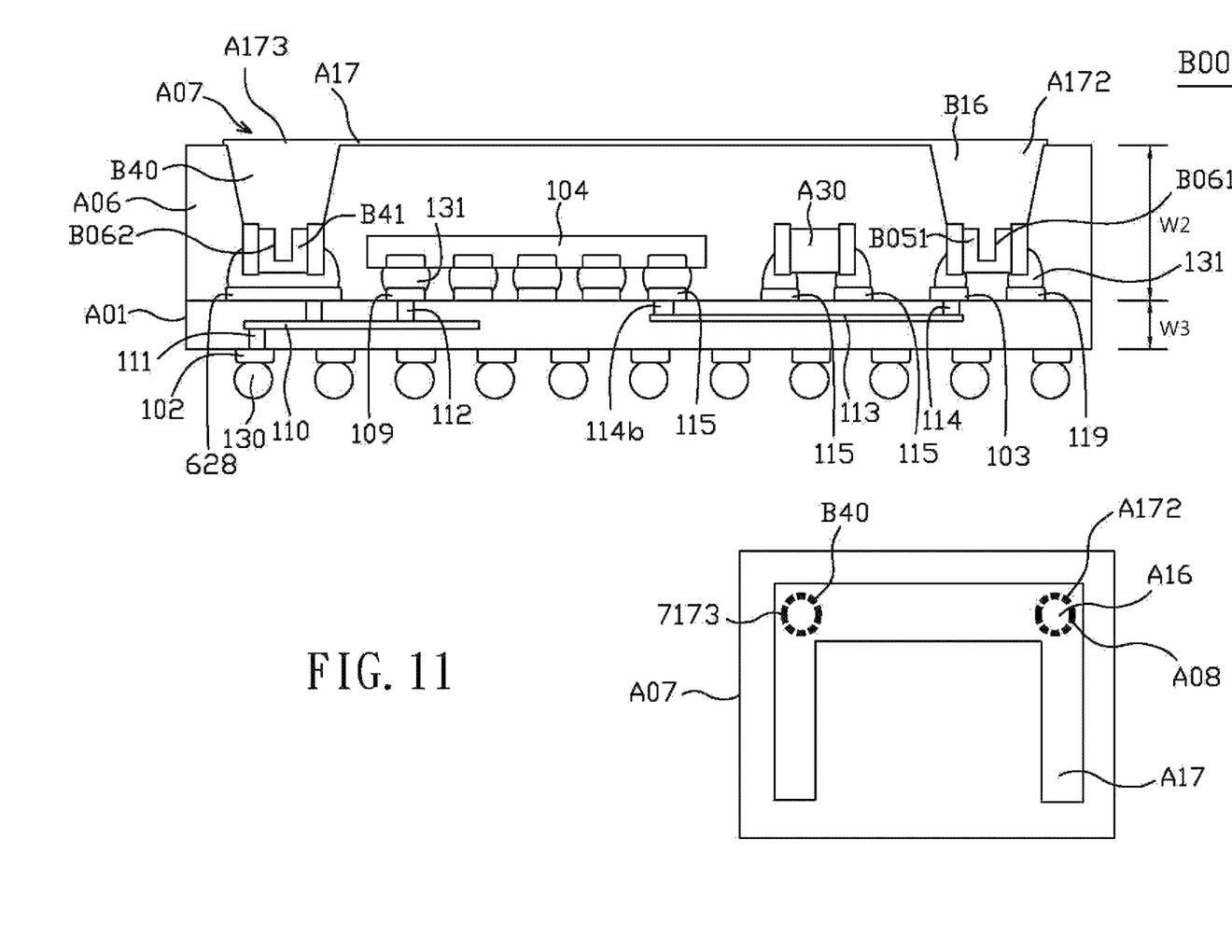

FIG. 11 is a cross-sectional view and a top view showing a structure of a semiconductor package with antenna according to another embodiment of the present invention. As shown in FIG. 11, in this embodiment, the structure of the semiconductor package B00 is similar to that of the semiconductor package A00. The difference between the semiconductor package B00 and the semiconductor package A00 is that the first SMD component B051 and the fourth SMD component B41 include at least one cavity B061, B062, and the feeding structure B16 and the short structure B40 are in contact with the cavities B061, B062, respectively.

Figure 12:
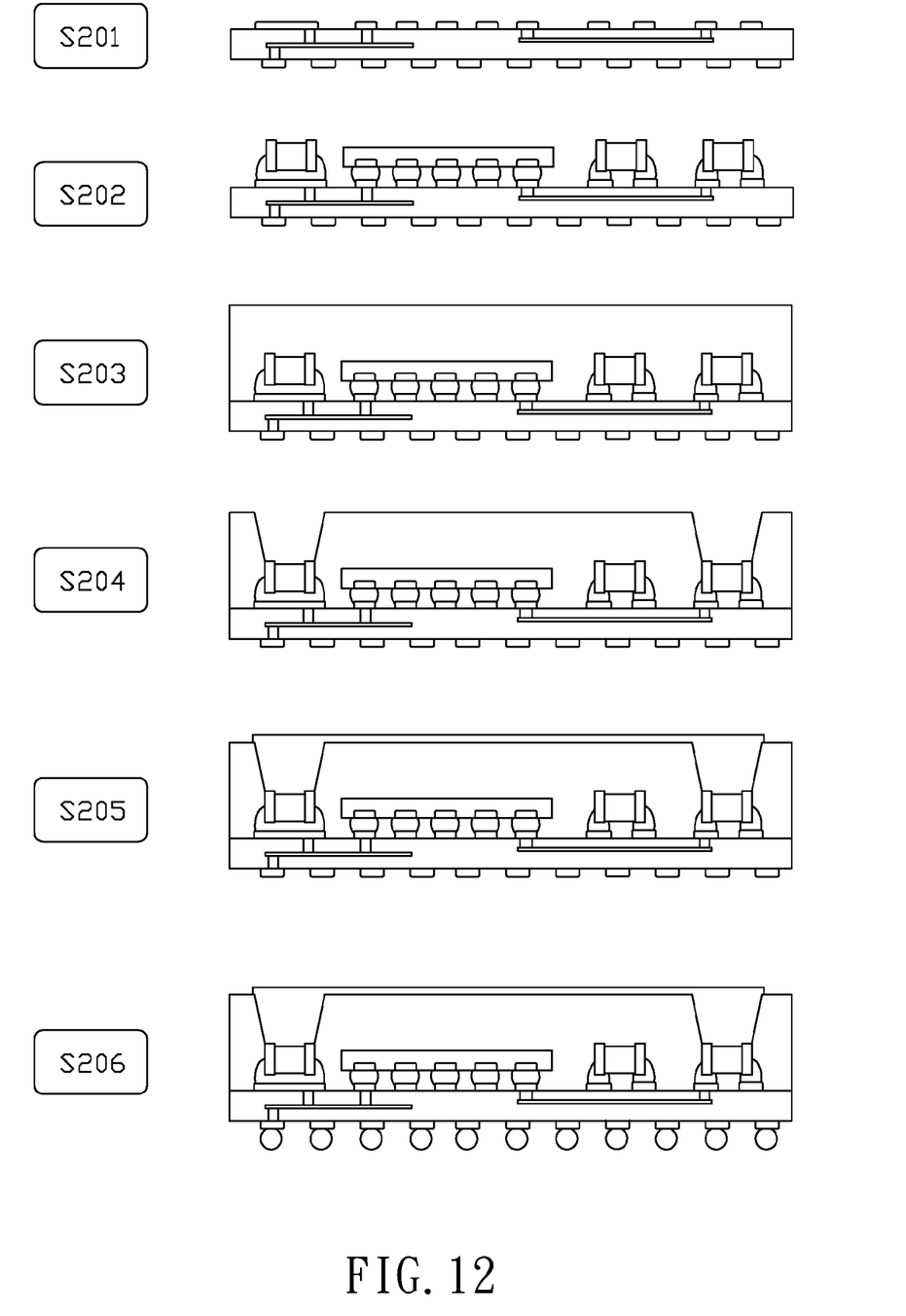
FIG. 12 is a flowchart showing of a method of manufacturing the semiconductor package with antenna of FIG. 10.

FIG. 12 is a flowchart showing a method of manufacturing the semiconductor package with antenna of FIG. 10. The method includes but not limited to the following steps:

Step S201: prepare a substrate A01;

Step S202: place and dispose the semiconductor component 104 and at least one first SMD component on the substrate A01;

Step S203: form the mold compound A06 on the substrate A01;

Step S204: form at least one opening (drill holes or saw openings) to make the first and fourth SMD components exposed;

Step S205: form the conformal antenna A07 on the top surface of the mold compound A06;

Step S206: place the solder balls 130 on the pin pads of the substrate A01.

In step S201, the substrate A01 may be prepared for supporting electronic components. In step S202, the semiconductor component 104, the passive components A30, the fourth SMD component A41 and at least one first SMD components are placed and disposed on the top side of the substrate A01. In step S203, a mold compound S206 such as epoxy mold compound is formed on the top side of the substrate A01. In an embodiment, the mold compound A06 completely covers the top side of the substrate A01 including the regions of the first SMD component A051, the semiconductor component 104, the passive components A30 mounted on the top side of the substrate A01. In step S204, a drilling process using laser to drill holes to make the first and fourth SMD component exposed from the holes (openings). The drilling depth (open depth) is smaller than the thickness W2 of the mold compound A06. In step S205, the conformal antenna A07 is formed by a coating process, screen printing, photolithography or lithography. For example, screen printing forms the conformal antenna A07. Liquid state of conductive material passes through open of the patterned antenna A17 (U shape) of the mask to a partial top surface of the mold compound A06 and drill holes. The conductive material is made of a material selected from a group consisting of graphite, nickel, tin, silver, copper, or a combination thereof. In step S206, the solder balls 130 are placed on the pin pads 102 of the substrate A01. In some embodiments, step S206 can be performed before one of step S202 to step S205.

In some embodiments, the method further includes but not limited to one or more the following steps:

Step S202b: clean flux on the substrate A01;

Step S203b: cure the mold compound A06;

Step S205b: cure the conformal antenna A07;

Step S206b: separate the semiconductor package A00 from other semiconductor packages on the substrate A01.

The encapsulation process in step S203 is preformed after flux on the substrate A01 has been clean in step S202b so that process flow can avoid delamination between the substrate A01 and mold compound A06. In step S203b and step S205b, the curing process can reduce harden time of the mold compound A06 and the conformal antenna A07. In step S206b, the semiconductor packages on the substrate A01 may be separated from each other. During a semiconductor package fabrication process, a single substrate, in this case a substrate A01, may include a plurality of semiconductor packages. After all of the semiconductor packages on the substrate A01 have been built, the semiconductor packages may be separated from each other through dicing.

In brief, the present disclosure discloses a semiconductor package with antenna. The inventive semiconductor package employs a PCB antenna or a conformal antenna disposed on the mold compound. The PCB antenna (or the conformal antenna) and the wireless function circuit are packaged together. Consequently, the semiconductor package acts a package component and can be applied to a system circuit board of a general wireless communication device, such as a wearable point-of-sale (POS) terminal or a portable barcode scanner. The LO leakage of the semiconductor package using the PCB antenna or the conformal antenna can be reduced easily and controlled precisely by adjusting isolation between the PCB antenna (or the conformal antenna) and the wireless function circuit. Specifically, the height of the semiconductor package can be further reduced using the conformal antenna structure and the method can be easily performed to fabricate the semiconductor package with antenna for cost reduction and better yield.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor package with an antenna, comprising:

preparing a substrate;

disposing a semiconductor component and at least one first surface mount device (SMD) component on the substrate;

forming a mold compound on the substrate covering the semiconductor component and the at least one first SMD component;

forming at least one opening in the mold compound to expose the first SMD component after the step of forming a mold compound;

filling the at least one opening with a conductive material after the step of forming at least one opening; and forming a conformal antenna on a top surface of the mold compound, wherein the step of forming the at least one opening comprises forming at least one cavity extending through the at least one first SMD component.

2. The method of claim 1, wherein the conformal antenna is formed by a coating process, screen printing, photolithography or lithography.

3. The method of claim 1, wherein the step of forming the conformal antenna comprises forming at least one opening in the conformal antenna, and forming a feeding structure in the at least one opening formed in the conformal antenna to directly connect the at least one first SMD component on the substrate and a feeding terminal of a patterned antenna of the conformal antenna.

4. The method of claim 1, further comprising a curing step to cure the conformal antenna.

5. The method of claim 1, wherein the first SMD component is a metallic structure or a resistor.

6. The method of claim 1, wherein the at least open opening formed in the mold compound extends beyond a top surface of the at least one first SMD component toward the substrate.

7. The method of claim 1, further comprising the step of forming the conductive material in the at least one cavity.

8. The method of claim 1, wherein the at least one first SMD component is a stack structure formed by two SMDs stacked one on top of the other.

\* \* \* \* \*